United States Patent [19]

Sendelweck

[11] 4,322,770

[45] Mar. 30, 1982

[54] LATCH-UP PREVENTION CIRCUIT FOR POWER OUTPUT DEVICES USING INDUCTIVE LOADS

[75] Inventor: Gene K. Sendelweck, Indianapolis, Ind.

[73] Assignee: RCA Corporation, New York, N.Y.

[21] Appl. No.: 125,647

[22] Filed: Feb. 28, 1980

[51] Int. Cl.³ .............................................. H02H 9/04
[52] U.S. Cl. ....................................... 361/91; 361/56; 361/111; 330/207 P; 307/303
[58] Field of Search .................. 361/91, 111, 110, 88, 361/56, 90; 330/207 P, 298; 307/303

[56] References Cited

U.S. PATENT DOCUMENTS

| | | |
|---|---|---|
| 3,390,346 | 6/1968 | Wheatley, Jr. ........................ 330/298 |
| 4,023,074 | 5/1977 | Fichtner ................................ 361/88 |
| 4,158,178 | 6/1979 | Schade, Jr. ......................... 361/91 X |
| 4,178,619 | 12/1979 | Seiler et al. ............................ 361/91 |

Primary Examiner—Patrick R. Salce
Attorney, Agent, or Firm—Paul J. Rasmussen; William H. Meagher; W. Brinton Yorks, Jr.

[57] ABSTRACT

A circuit arrangement is provided which prevents latching in a power amplifier or supply. A power output transistor drives an inductive load, which is coupled in parallel with the collector-to-emitter path of the transistor. A first diode is coupled between the transistor and a point of reference potential, and is in series with the collector-to-emitter path of the transistor and poled to be of like polarity to the base-emitter junction of the transistor. A capacitor is coupled in parallel with the first diode, and a second diode is coupled in parallel with the inductive load and is poled in an opposite sense to the first diode. The second diode is chosen to have a voltage drop such that a negative voltage impulse from the inductive load will be clipped at a voltage which is the difference between the voltage drops of the first and second diodes.

5 Claims, 3 Drawing Figures

LATCH-UP PREVENTION CIRCUIT FOR POWER OUTPUT DEVICES USING INDUCTIVE LOADS

This invention relates to power output devices using inductive loads, and in particular, to a circuit for protecting a power amplifier against latching due to inductively developed voltage pulses.

Power output transistors, such as those used in audio amplifiers and switched power supplies, frequently drive inductive loads, such as relays, transformers, or audio loudspeaker coils. Power transistors with inductive loads will generally perform in an acceptable manner when operating linearly. Under linear operating conditions, the transistors continuously behave as low impedance voltage sources for the loads, which provides adequate damping for inductively developed voltage spikes which may occasionally be coupled back to the transistors from the loads. However, when the power output transistors in a switched power supply are momentarily switched to a low (off) state by the driving signal, or the transistors in an audio amplifier are driven nonlinearly by a high deviation output signal, the transistors will present a high impedance to the inductive loads. The inductive energy in the loads will build to a peak value and then will surge back into the amplifier or power supply. This large surge of energy can appear as a large negative voltage pulse, which can create regenerative current loops in one or more of the power output transistors and other circuitry in the amplifier or power supply. The current loops can "latch" the circuits in the amplifier or power supply, a condition in which the output of the circuits is reduced to a fraction of the normal maximum output level. The latching condition will persist until power is removed from the latched circuitry.

This problem of latching is even more acute when the power output transistors are not discrete devices, but are integrated as part of a monolithic integrated circuit chip, such as the RCA CA3134 or the TDA1190 TV Sound I.F. and Audio Output Subsystems integrated circuits. In this case, the large negative voltage pulses will not only latch one or more of the power output transistors, but the currents developed by the pulses can be conducted to other areas of the I.C. chip, where other circuit functions can be adversely affected. Moreover, the resultant high current densities on the small I.C. chip can cause one or more of the transistors on the chip to be destroyed, and can also melt the metallic conductors formed on the surface of the chip.

One technique for preventing latching in a power amplifier I.C. is shown in U.S. patent application Ser. No. 035,347 filed May 2, 1979, now abandoned, and entitled "ANTI-LATCH CIRCUIT FOR POWER OUTPUT DEVICES USING INDUCTIVE LOADS", by Donald Snyder and Fletcher Bozarth. The Snyder and Bozarth arrangement includes a capacitor and a resistor coupled in parallel between the emitter of the power output transistor and ground. An inductive load is coupled in parallel with series connection of the collector-to-emitter path of the power output transistor and the resistor-capacitor combination. Without the resistor-capacitor combination, latching of the I.C. would occur when a negative voltage impulse is coupled back to the collector of the power output transistor from the inductive load. When the voltage impulse goes negative by approximately $-0.5$ volts, the collector of the transistor and the adjoining substrate material of the I.C. will form an effective diode junction, which is forward-biased by the negative voltage impulse. Current will then surge through the substrate to other areas of the I.C., which then can become latched.

The capacitor and resistor of the Snyder and Bozarth arrangement prevent such latching under most circumstances by floating the D.C. voltage at the emitter of the power output transistor. The capacitor is charged to a positive voltage by current flowing through the power output transistor, which is applied to a P+ region of the I.C. that is coupled to the junction of the transistor emitter and the resistor-capacitor combination. A negative voltage impulse at the collector of the power output transistor will forward-bias the effective diode junction formed by the transistor collector and the P+ region before it will forward-bias the collector-substrate effective diode, since the P+ region is at a higher potential than the grounded substrate. The negative voltage impulse is then harmlessly dissipated by the effective diode formed by the transistor collector and the P+ region before the collector-substrate effective diode can become forward biased.

It has been found that the Snyder and Bozarth arrangement will fail to prevent latching under certain operating conditions. During quiet periods, the power output transistor will provide only a small amount of current for the resistor-capacitor combination. The capacitor will then discharge through the resistor, and the voltage level at the emitter of the transistor will drift down toward the substrate ground level. The sudden application of a high deviation signal can then result in a negative voltage impulse at the collector of the transistor which will foward-bias the collector-substrate junction, thereby causing the latched condition.

In accordance with the principles of the present invention, a circuit arrangement is provided which prevents latching in a power amplifier or supply. A power output transistor drives an inductive load, which is coupled in parallel with the collector-to-emitter path of the transistor. A first diode is coupled between the transistor and a point of reference potential, and is in series with the collector-to-emitter path of the transistor and poled to be of like polarity to the base-emitter junction of the transistor. A capacitor is coupled in parallel with the first diode, and a second diode is coupled in parallel with the inductive load and is poled in an opposite sense to the first diode. The second diode is chosen to have a voltage drop such that a negative voltage impulse from the inductive load will be clipped at a voltage which is the difference between the voltage drops of the first and second diodes.

Figure 1:
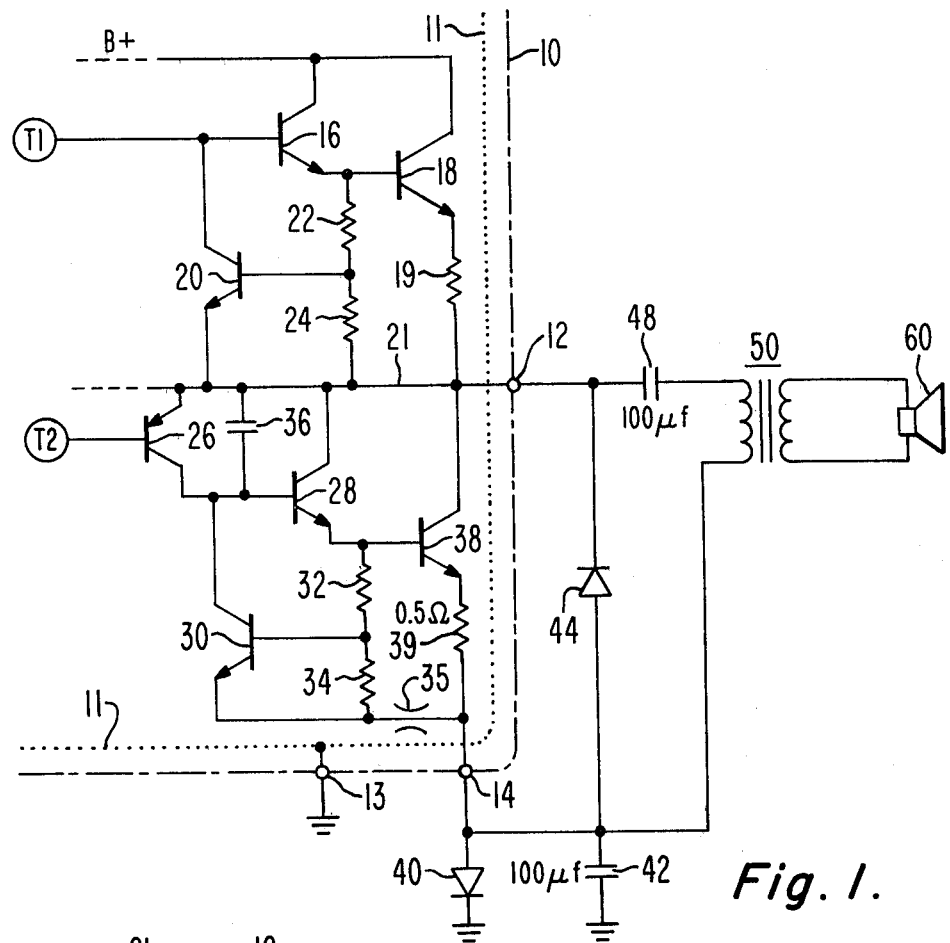
FIG. 1 illustrates in schematic diagram form an antilatch circuit constructed in accordance with the principles of the present invention.

Referring to FIG. 1, the power output section of an audio monolithic integrated circuit chip 10 is shown connected to a loudspeaker 60. A dashed and dotted line 10 represents the boundary of the integrated circuit chip. Connections to the chip from external components are made at terminals 12, 13 and 14. The substrate 11 of the integrated circuit chip is connected to a point of reference potential (ground) at terminal 13. The power output section of the I.C. chip is driven by signals of mutually opposite polarity applied from other portions of the chip at internal chip connections T1 and T2. The signal applied at connection T1 is coupled to the base of an emitter follower coupled transistor 16. The collector of transistor 16 is coupled to a source of supply voltage (B+) and its emitter is coupled to the base of a power output transistor 18. The collector of output transistor 18 is coupled to the B+ supply, and its emitter is coupled to an audio output terminal 12 by a resistor 19. Transistor 18 is protected against output short circuits by resistors 22 and 24, and a transistor 20. Resistors 22 and 24 are serially coupled from the emitter of transistor 16 to a conductor 21, which is connected to the audio output terminal 12. Transistor 20 has a collector coupled to the base of transistor 16, a base coupled to the junction of resistors 22 and 24, and an emitter coupled to conductor 21.

The signal applied at connection T2 is coupled to the base of a transistor 26, which has its emitter coupled to conductor 21 and its collector coupled to the base of an emitter follower coupled transistor 28. The collector of transistor 28 is coupled to conductor 21, and its emitter is coupled to the base of a power output transistor 38. A capacitor 36 is coupled from the collector to the emitter of transistor 26. Power output transistor 38 has its collector coupled to the audio output terminal 12, and its emitter is coupled to an output terminal 14 by a resistor 39. Short circuit protection for transistor 38 is provided by a second protection circuit including resistors 32 and 34 and a transistor 30. Resistors 32 and 34 are serially connected between the emitter of transistor 28 and output terminal 14. The collector of transistor 30 is coupled to the base of transistor 28, its base is coupled to the junction of resistors 32 and 34, and its emitter is coupled to output terminal 14. The second short circuit protection circuit operates in a manner similar to the short-circuit protection circuit described previously.

Discrete circuit components are located external to I.C. chip 10 and are connected to the chip at terminals 12 and 14. A coupling capacitor 48 supplies output signals from audio output terminal 12 to the primary winding of an output transformer 50. The other end of the primary winding of transformer 50 is coupled to output terminal 14. The secondary winding of transformer 50 is coupled to the coil of a loudspeaker 60.

In FIG. 1, it may be seen that resistor 39 is coupled to resistor 34 and the emitter of transistor 30. In the integrated circuit chip 10 of the illustrated embodiment, this connection is not made by a conventional metallized conductor on the surface of the chip, but is made by a "tunnel" 35 of P+ type semiconductor material. The complexity of the metallized conductors on the surface of the integrated circuit chip 10 necessitates the use of this tunnel connection in this instance. The tunnel 35 is physically located in close proximity with the N+ collector region of NPN transistor 38 and will be seen to provide a second function in addition to its connector function.

Figure 2:
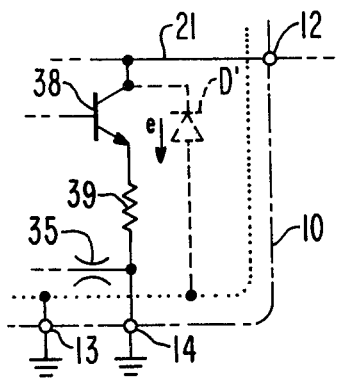
FIG. 2 illustrates in schematic diagram form a prior art use of the output circuit of FIG. 1.

FIG. 1 also includes two diodes 40 and 44, and a capacitor 42. By omitting these elements from consideration for the moment, and connecting terminal 14 to terminal 13, a typical prior art arrangement is formed, as shown in FIG. 2. When so connected, transistor 38 is capable of latching under large signal conditions which cause the transistor to operate nonlinearly. Transformer 50 can develop a large negative voltage pulse under these conditions, which will surge back to the collector of transistor 38 through terminal 12. The negative voltage pulse will reach the N+ collector region of NPN transistor 38, driving it toward and below ground potential (zero volts). When the N+ collector reaches a potential of approximately −0.5 volts, the N+ collector will form two diodes with the nearby P+ tunnel 35 and the I.C. substrate, respectively, which are both at ground potential by virtue of the connections at terminals 13 and 14. These diodes will begin to conduct at this time, and current developed by the negative voltage pulse will surge through the diode junction formed by the N+ collector of transistor 38 and the substrate material, as shown by diode D' in FIG. 2. This current, which has a magnitude on the order of 600 milliamps, will be injected into the substrate as negatively-charged minority carriers, as shown by arrow e in FIG. 2. The current flow will reduce the output of the transistor 38 to a fraction of its previous level. Since the minority carriers are negatively charged, they will seek a path to a positive potential, which in this case is the B+ supply. The minority carriers will thus flow through the substrate material to other areas of the integrated circuit 10, where they can cause latching in the other circuitry on the chip, thereby disabling these circuits also. Large current surges of this type have been known to destroy transistor 38 and melt the metallized B+ conductor under the most adverse latching conditions.

The latching problem of the prior art configuration is prevented by the inclusion of diodes 40 and 44 and capacitor 42 in the arrangement of FIG. 1. Diode 40 has an anode coupled to terminal 14 and a cathode coupled to ground. Capacitor 42 is coupled in parallel with the diode 40. A diode 44 is coupled between terminals 12 and 14, with an anode coupled to terminal 14 and a cathode coupled to terminal 12.

In operation, diode 40 is maintained in a conductive state by the flow of signal and quiescent emitter current from transistor 38. Diode 40 therefore maintains terminal 14 at one diode voltage drop (approximately +0.6 volts) above ground potential. Capacitor 42 serves to bypass terminal 14 to ground for signal frequencies, and also filters the D.C. voltage at terminal 14. Since the diode 40 operates to maintain terminal 14 at a voltage above substrate ground, the capacitor 42 can be of a smaller value than in the Snyder and Bozarth arrangement, in which the charge stored by the capacitor performed this function. In addition, since the voltage at terminal 14 can go no higher nor lower than approximately +0.6 volts due to the diode 40, the output transistors 18 and 38 operate over a fixed voltage range between the level at terminal 14 and the B+ rail. This is not true of the Snyder and Bozarth arrangement, in which the capacitor voltage and hence the voltage at terminal 14 could vary between zero and approximately one volt in accordance with the drive conditions of the output transistor.

When a high deviation signal is applied to the transformer 50 and results in the development of a negative voltage pulse at terminal 12, the pulse is discharged by the conduction of diode 44. Diode 44 will begin to conduct when the voltage pulse at the cathode of diode 44 reaches a level which is equal to the voltage level at the anode of diode 44 (i.e., the voltage at terminal 14) less the forward biased voltage drop across diode 44. This operation is illustrated in FIG. 3.

Figure 3:
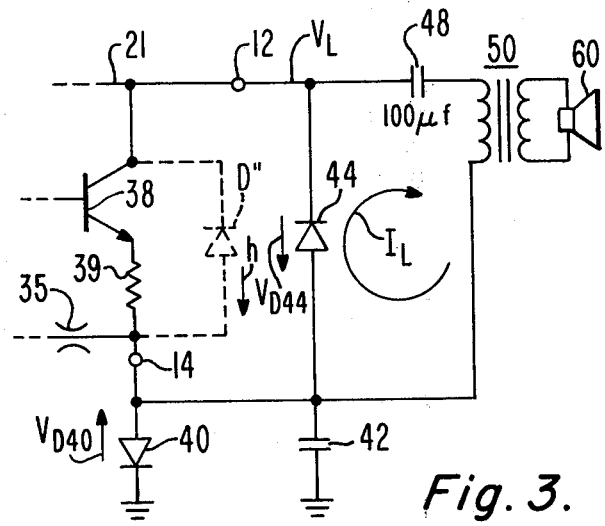
FIG. 3 illustrates a portion of the schematic diagram of FIG. 1.

FIG. 3 is a partial illustration of the arrangement of FIG. 1, in which the reference numerals of the elements remain unchanged. When the negative voltage pulse at the cathode of diode 44 reaches a level sufficient to forward bias diode 44, inductive current $I_L$ flows through the loop including diode 44, capacitor 48, and the primary winding of transformer 50. The $I_L$ current loop is thus seen to exclude all of the elements of the I.C., and specifically transistor 38. In this way, the negative voltage pulse is eliminated without damaging elements of the I.C.

Additionally, the $I_L$ current loop does not include diode 40 or capacitor 42. The impedance of these elements is unaffected by the $I_L$ current flow, which ensures that they will continue to maintain the voltage level at terminal 14 at the +0.6 voltage level developed by diode 40.

The flow of $I_L$ current through diode 44 develops a voltage drop across diode 44, as indicated by arrow $V_{D44}$. If the peak $I_L$ current is known, a diode of appropriate current-handling capability may be chosen for diode 44. In addition, diode 44 may be chosen to have a voltage drop $V_{D44}$ which is sufficient to keep the negative voltage swing at the cathode of diode 44 small enough to prevent latch-up. The negative voltage swing $V_L$ at the cathode of diode 44 may be expressed as:

$$V_L = V_{D40} - V_{D44},$$

where $V_{D40}$ is the constant voltage drop across diode 40. For example, latch-up can occur when $V_L$ reaches a level of −0.5 volts, at which level the diode junction between the N+ collector of transistor 38 and the substrate material becomes forward biased. It is desirable, then, to prevent $V_L$ from reaching this −0.5 volt level. In the embodiment of FIG. 3, the constant voltage drop across diode 40, $V_{D40}$, is approximately +0.6 volts, and diode 44 is chosen to have a maximum voltage drop $V_{D44}$ of approximately one volt. Thus, $$V_L = +0.6 - 1.0 = -0.4 \text{ volts},$$

which is less than the −0.5 volt level at which latch-up can occur.

The dissipation of the negative voltage pulse at terminal 12 is supplemented by the effective diode junction formed by the N+ collector of transistor 38 and the nearby tunnel 35 of P+ material previously described. The +0.6 volt level which is maintained at terminal 14 by diode 40 and capacitor 42 is applied to the P+ tunnel 35. This means that the effective diode junction formed by the P+ tunnel 35 and the N+ collector of transistor 38 will begin to be forward biased when the negative voltage pulse has reduced the voltage at the collector of transistor 38 to approximately zero volts. The term "approximately" is appropriate here because the P+ tunnel is not in direct physical contact with the N+ collector, but is located nearby in the same epitaxial boat region in which the transistor 38 is fabricated. Thus a region of epitaxial material separates the two regions of the effective diode, which gives the diode inherently poor conduction characteristics as compared to diodes 40 or 44. As the voltage at the collector of transistor 38 becomes increasingly more negative, the effective diode will become increasingly more conductive to dissipate some of the charge of the negative voltage pulse.

The effective diode is represented by diode D″ in FIG. 3. As the diode D″ becomes forward biased by current from the negatively-directed voltage pulse, the P+ tunnel region reacts by injecting a flow of positively-charged minority carriers (holes) into the surrounding epitaxial boat region. Since these minority carriers are positively charged, they will flow to a lower potential, which in this case is the grounded substrate which underlies the epitaxial boat region. This minority carrier flow is represented by arrow h in FIG. 3. Once the minority carriers reach the substrate, they harmlessly dissipate as ground current and eventually flow to the ground connection of the I.C. power supply at terminal 13. In this way, the effective diode D″ supplements the operation of diode 44 to dissipate inductively-developed negative voltage pulses at terminal 12 before the effective diode formed by the collector of transistor 38 and the substrate can become forward biased and cause latching in the integrated circuit.

It may be appreciated that any P+ region which is located near the collector region of transistor 38 and is subject to the bias potential at terminal 14 may form the P+ region of an effective diode which functions in the same manner as diode D″ in FIG. 3.

What is claimed is:

1. A power output circuit which is prevented from latching due to voltage pulses developed by an inductive load comprising:

a monolithic integrated circuit chip including a semiconductor substrate of one type conductivity coupled to a point of reference potential, means for developing a control signal, and a transistor having a base coupled to receive said control signal, an emitter coupled to a first terminal, and a collector of opposite type conductivity coupled to a second terminal, said collector and said substrate forming a diode junction;

a first diode, located external to said integrated circuit chip, coupled between said first terminal and said point of reference potential, and forward biased so as to maintain a given potential difference between said reference potential and the potential at said first terminal;

a second diode, located external to said integrated circuit chip and coupled between said first and second terminals in parallel with the collector-to-emitter path of said transistor, and poled for conduction in a direction opposite to the forward biased conduction direction of the collector-to-emitter path of said transistor at a first threshold level at said collector electrode of said transistor which is substantially equal to the difference between said potential at said first terminal and the forward biased voltage drop of said second diode; and means located external to said integrated circuit chip, for coupling said inductive load between said first and second terminals in parallel with said collector-to-emitter path of said transistor, wherein voltage pulses developed by said inductive load at said collector electrode of said transistor render said second diode conductive at said first threshold level, which is attained by said voltage pulses prior to attaining a second threshold level which is sufficient to forward bias said diode junction.

2. The power output circuit of claim 2 wherein said second diode forms a loop circuit with said inductive load to conduct current resulting from said voltage pulse in said loop, external to said integrated circuit chip.

3. The power output circuit of claim 2 wherein said second threshold level is substantially equal to the difference between said reference potential and the forward biased voltage drop of said diode junction formed by said collector and said substrate.

4. The power output circuit of claim 1 further comprising:
a capacitor located external to said integrated circuit chip and coupled in parallel with said first diode; and
a semiconductive region, located on said integrated circuit chip in close proximity to said collector of said transistor, and coupled to said first terminal, said region forming, in combination with said collector, a second diode junction which becomes forward biased by said voltage pulses at a third threshold level which is attained by said voltage pulses prior to the attainment of said second threshold level.

5. The power output circuit of claim 4, wherein said third threshold level is substantially equal to said reference potential.

* * * * *